US006847923B2

(12) United States Patent
Donovan

(10) Patent No.: US 6,847,923 B2
(45) Date of Patent: Jan. 25, 2005

(54) DESIGN SOFTWARE: SELF-PIERCING RIVET ANALYSIS (F.E.A.)

(75) Inventor: Steven P. Donovan, Roscoe, IL (US)

(73) Assignee: Textron Inc., Providence, RI (US)

( * ) Notice: Subject to any disclaimer, the term of this patent is extended or adjusted under 35 U.S.C. 154(b) by 402 days.

(21) Appl. No.: 09/942,015

(22) Filed: Aug. 29, 2001

(65) Prior Publication Data

US 2003/0046039 A1 Mar. 6, 2003

(51) Int. Cl.[7] .......................... G06F 19/00; G06F 17/50

(52) U.S. Cl. ................. 703/1; 703/2; 700/30; 700/98

(58) Field of Search .................. 703/1, 2, 22; 700/28, 700/29, 30, 31, 97, 98, 117

(56) References Cited

U.S. PATENT DOCUMENTS

| 5,594,651 A | 1/1997 | St. Ville | 700/98 |
| 5,796,617 A | 8/1998 | St. Ville | 700/98 |
| 6,263,252 B1 | 7/2001 | St. Ville | 700/98 |

OTHER PUBLICATIONS

Tang, Yifan: Characterization, Numerical Analysis, and Design of Switched Reluctance Motors, IEEE Transactions on Industry Applications, Vol. 33, No. 6, Nov./Dec. 1997, pp. 1544–2552.

Liu, et al. Finite Element Analysis and Computer–Aided Optimal Design of the Magnetic Field of Fluxgate Magnetometers, 15th Annual Conference of the Industrial Electronics Society, 1989. IECON '89, pp. 817–822.

Chen, et al. Design and Simulation Software Package of Switched Reluctance Machine Systems for Windows 9x in English, The 2000 IEEE Asia–Pacific Conference on Circuits and Systems, 2000. IEEE APCCAS 2000, pp. 489–492.

Jayakumar et al. Methods for Field Computaations for the Development of SSC Superconducting Magnets, IEEE Transactions on Magnets, Vol. 28, No. 2, Mar. 1992, pp. 1318–1323.

Primary Examiner—Russell Frejd
(74) Attorney, Agent, or Firm—Trexler, Bushnell, Giangiorgi, Blackstone & Marr, Ltd.

(57) ABSTRACT

Design software that is relatively easy to use and provides that a user need not be skilled at reading stress plots. The design software takes design requirements into account and indicates whether the proposed design meets the design requirements. The design software provides numerical output values for comparison to numerical design requirement input values so the user can readily see whether, and how, the design is unacceptable or is over-designed.

19 Claims, 17 Drawing Sheets

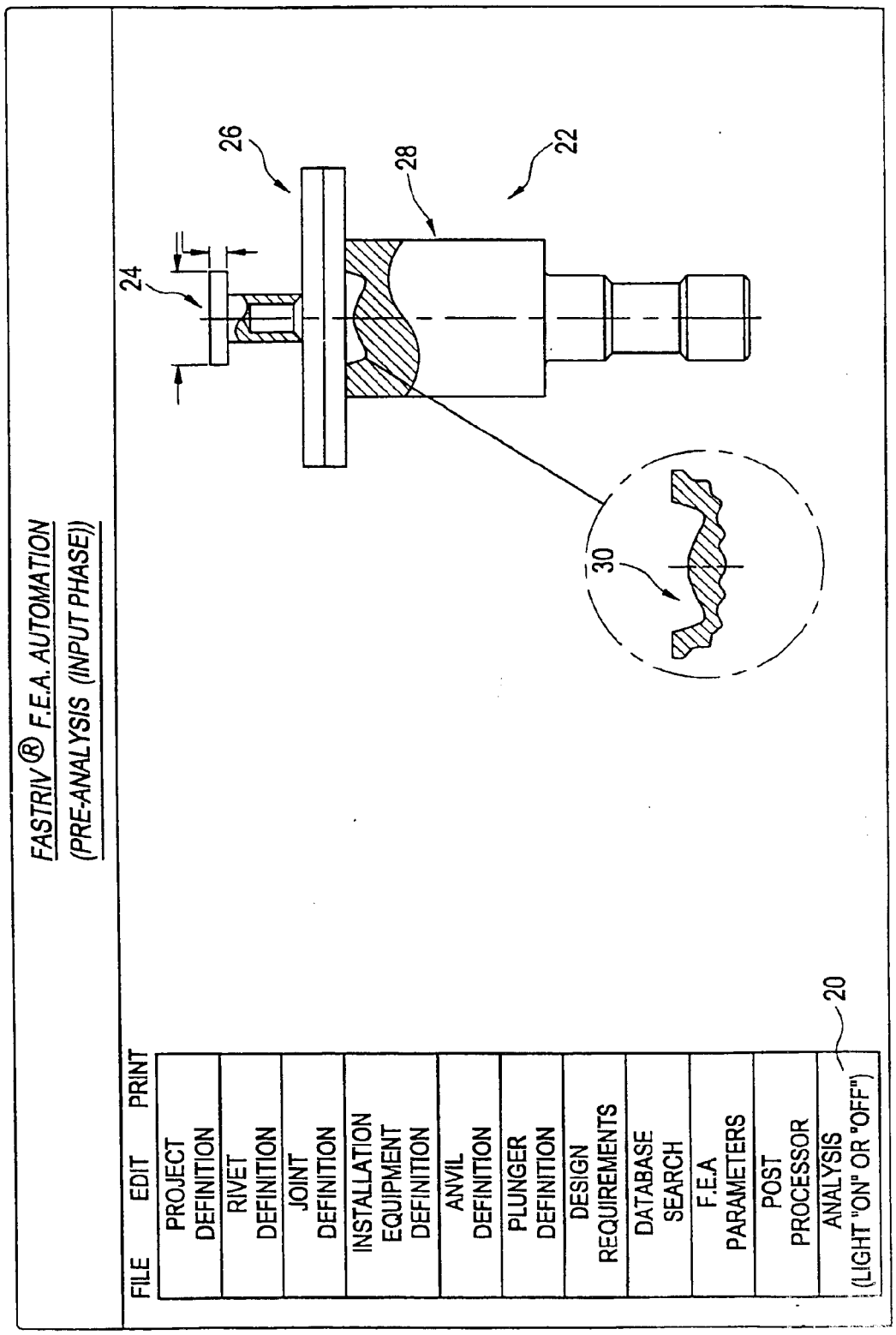

FIG. 3

*FASTRIV® F.E.A. AUTOMATION*
*(PRE-ANALYSIS / PROJECT DEFINITION)*

PROJECT DEFINITION

CUSTOMER NAME: _____

DATE: _____

ANALYSIS: _____

APPLICATION DESCRIPTION: _____

INTRODUCTION: _____

BACKGROUND: _____

RESULTS: _____

CONCLUSION: _____

PROJECT NUMBER: _____

| FILE | EDIT | PRINT |
|---|---|---|
| PROJECT DEFINITION | | |
| RIVET DEFINITION | | |
| JOINT DEFINITION | | |
| INSTALLATION EQUIPMENT DEFINITION | | |
| ANVIL DEFINITION | | |
| PLUNGER DEFINITION | | |
| DESIGN REQUIREMENTS | | |
| DATABASE SEARCH | | |
| F.E.A PARAMETERS | | |
| POST PROCESSOR | | |
| ANALYSIS (LIGHT "ON" OR "OFF") | | |

~20

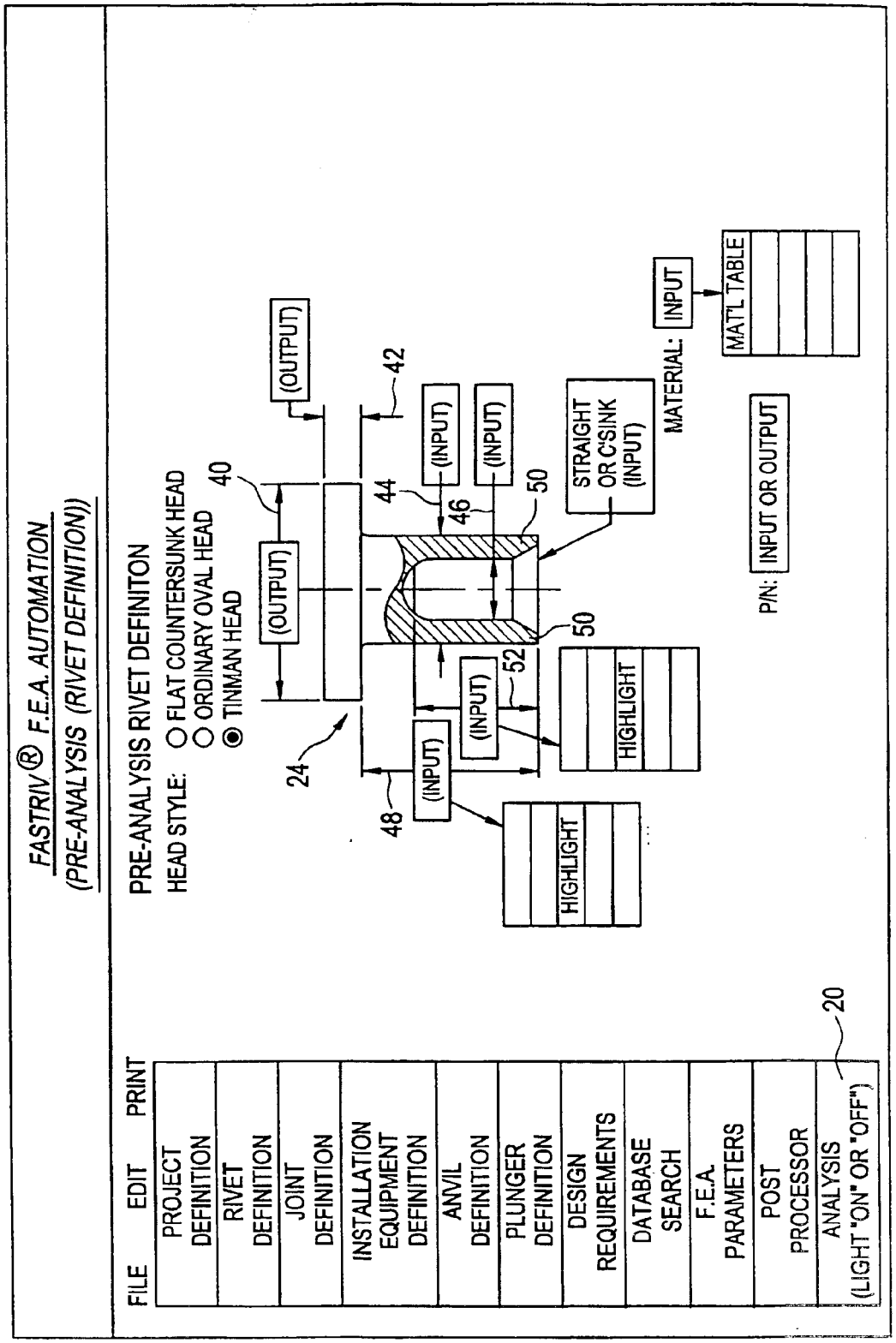

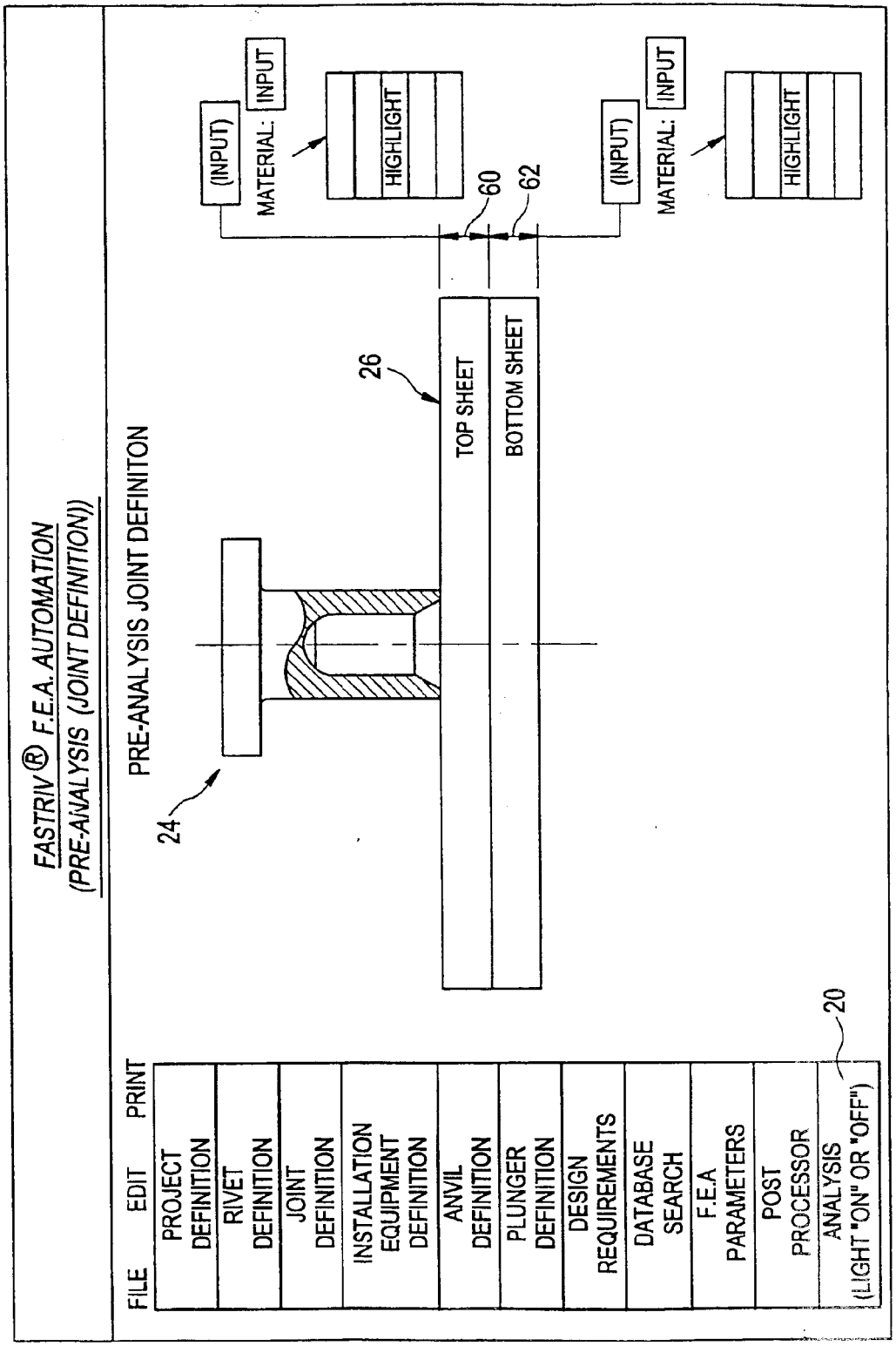

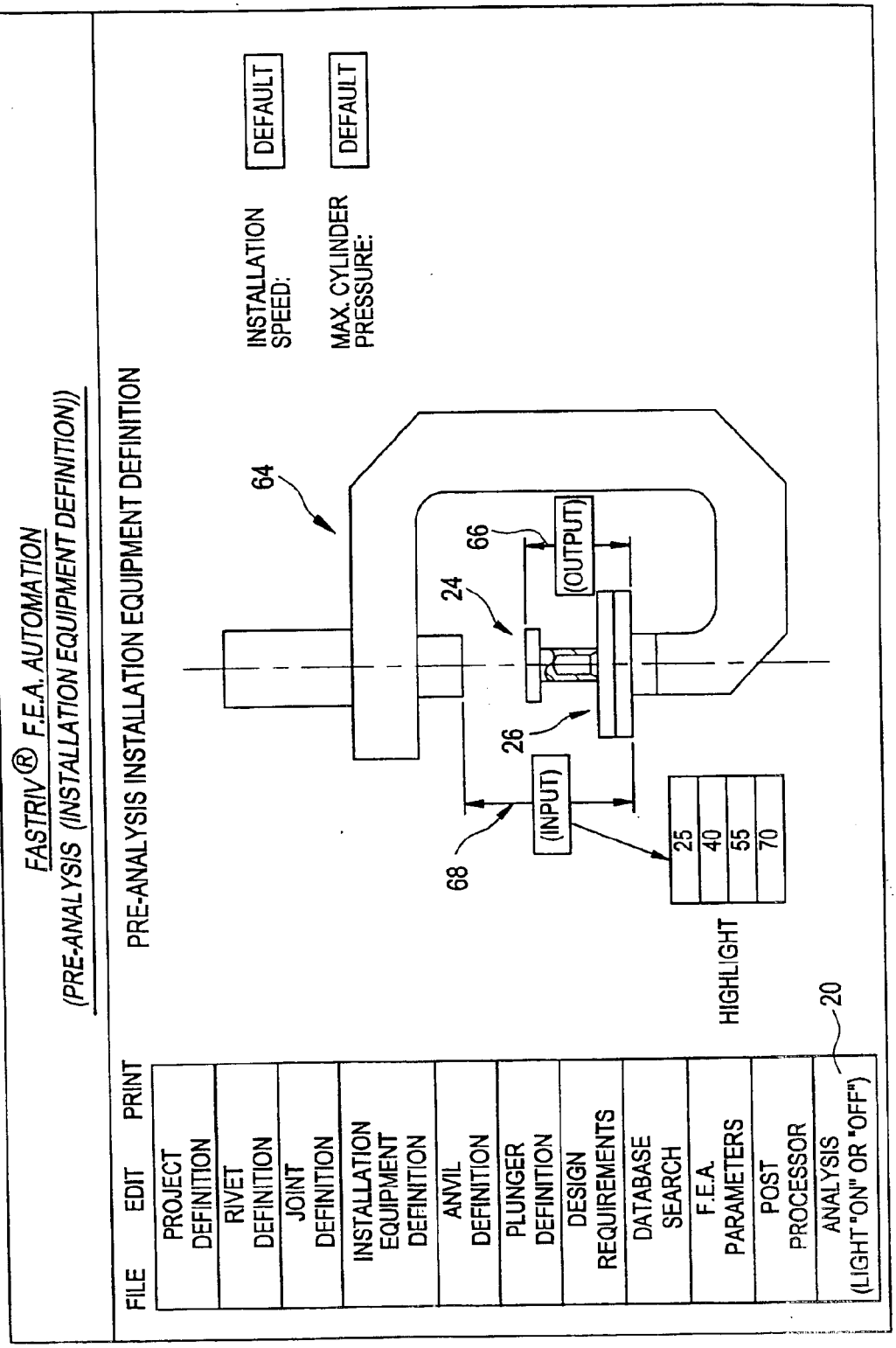

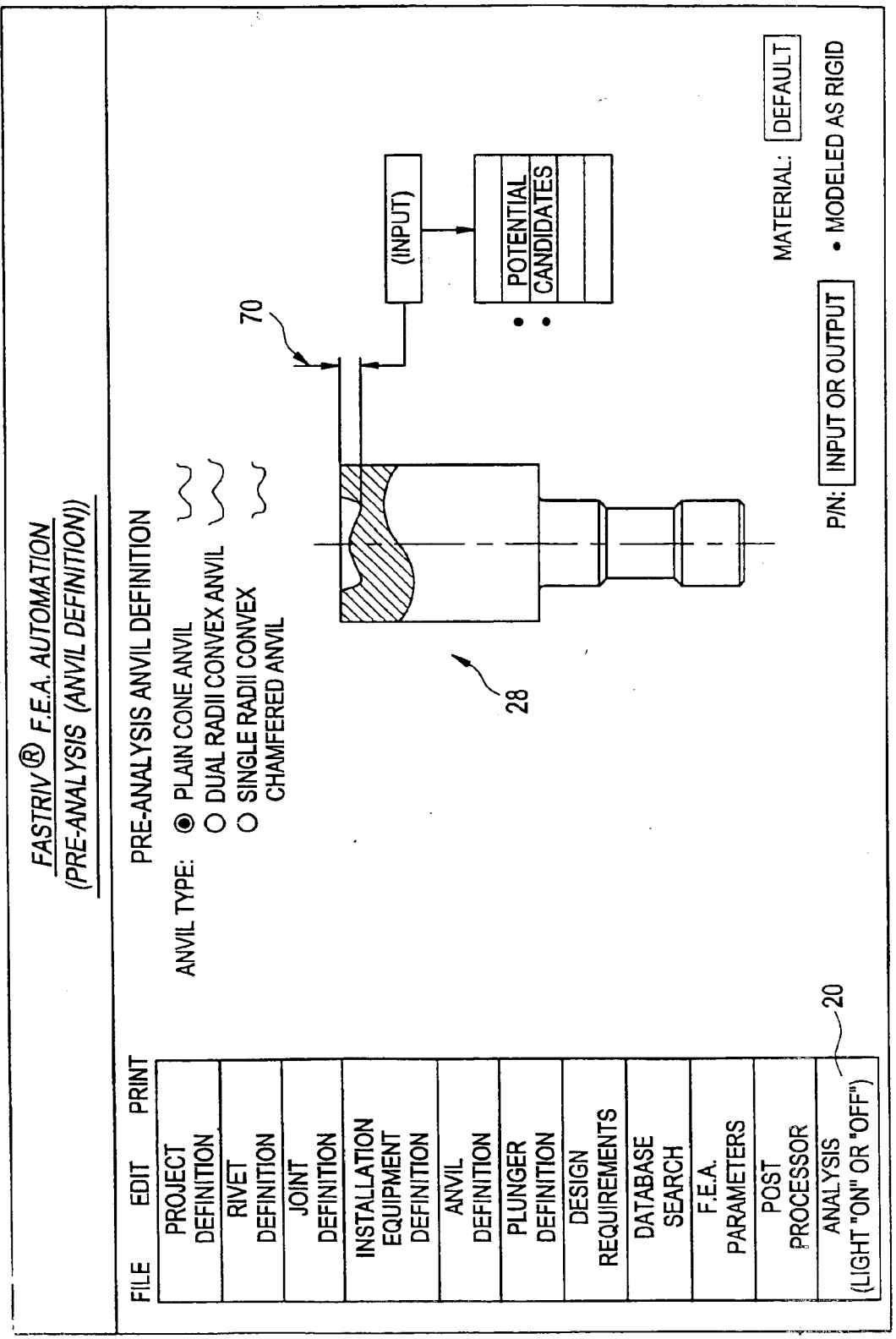

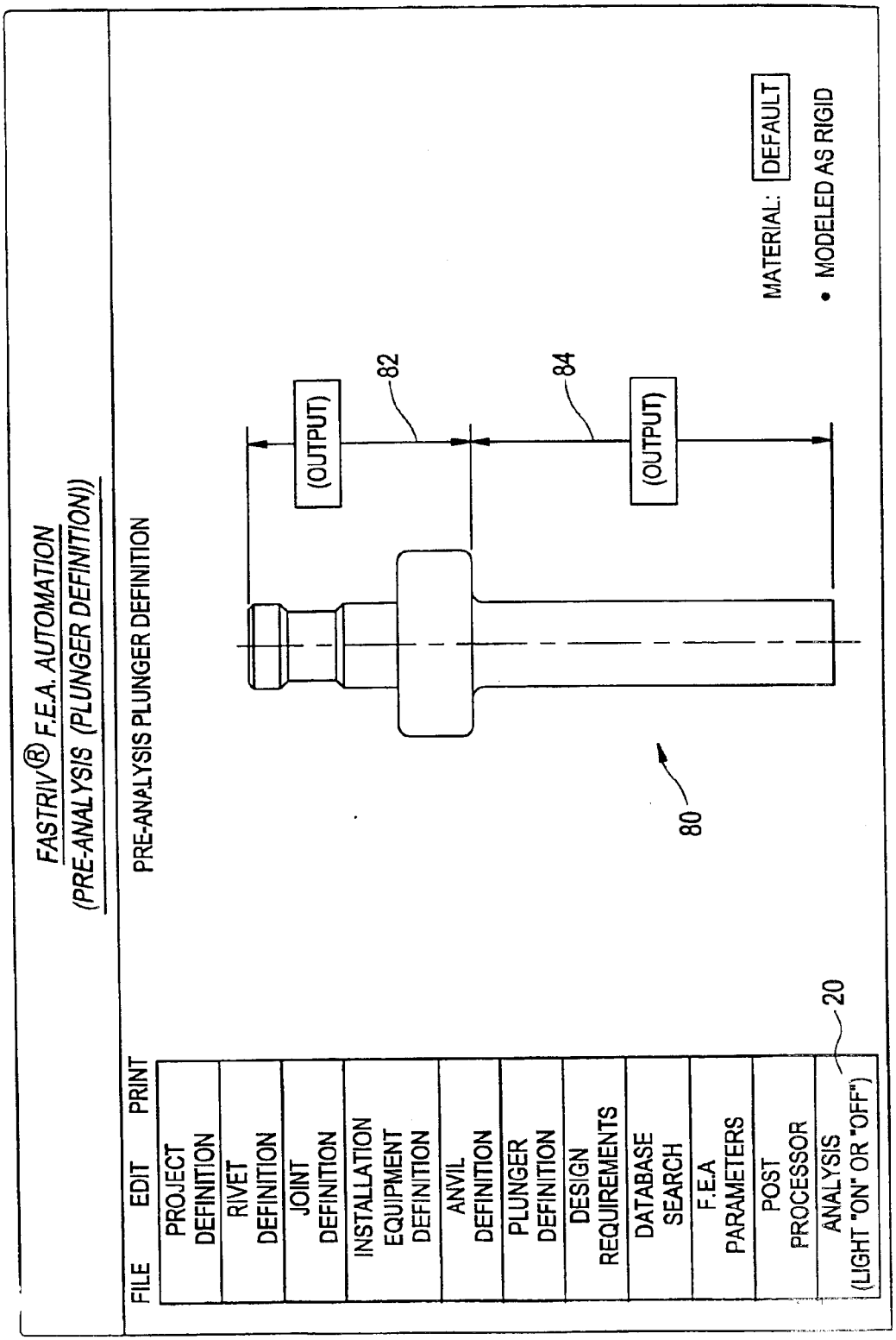

FIG. 10

FASTRIV® F.E.A. AUTOMATION
*(PRE-ANALYSIS DATABASE SEARCH)*

PRE-ANALYSIS DATABASE SEARCH

THE ABILITY TO SELECT ANY OF COMBINATION OF THE INPUTS AT THIS STAGE. THIS WILL TIE INTO A CENTRAL DATABASE

| FILE | EDIT | PRINT |
|---|---|---|
| PROJECT DEFINITION | | |
| RIVET DEFINITION | | |
| JOINT DEFINITION | | |
| INSTALLATION EQUIPMENT DEFINITION | | |
| ANVIL DEFINITION | | |
| PLUNGER DEFINITION | | |
| DESIGN REQUIREMENTS | | |
| DATABASE SEARCH | | |
| F.E.A. PARAMETERS | | |
| POST PROCESSOR | | |
| ANALYSIS (LIGHT "ON" OR "OFF") | | |

~20

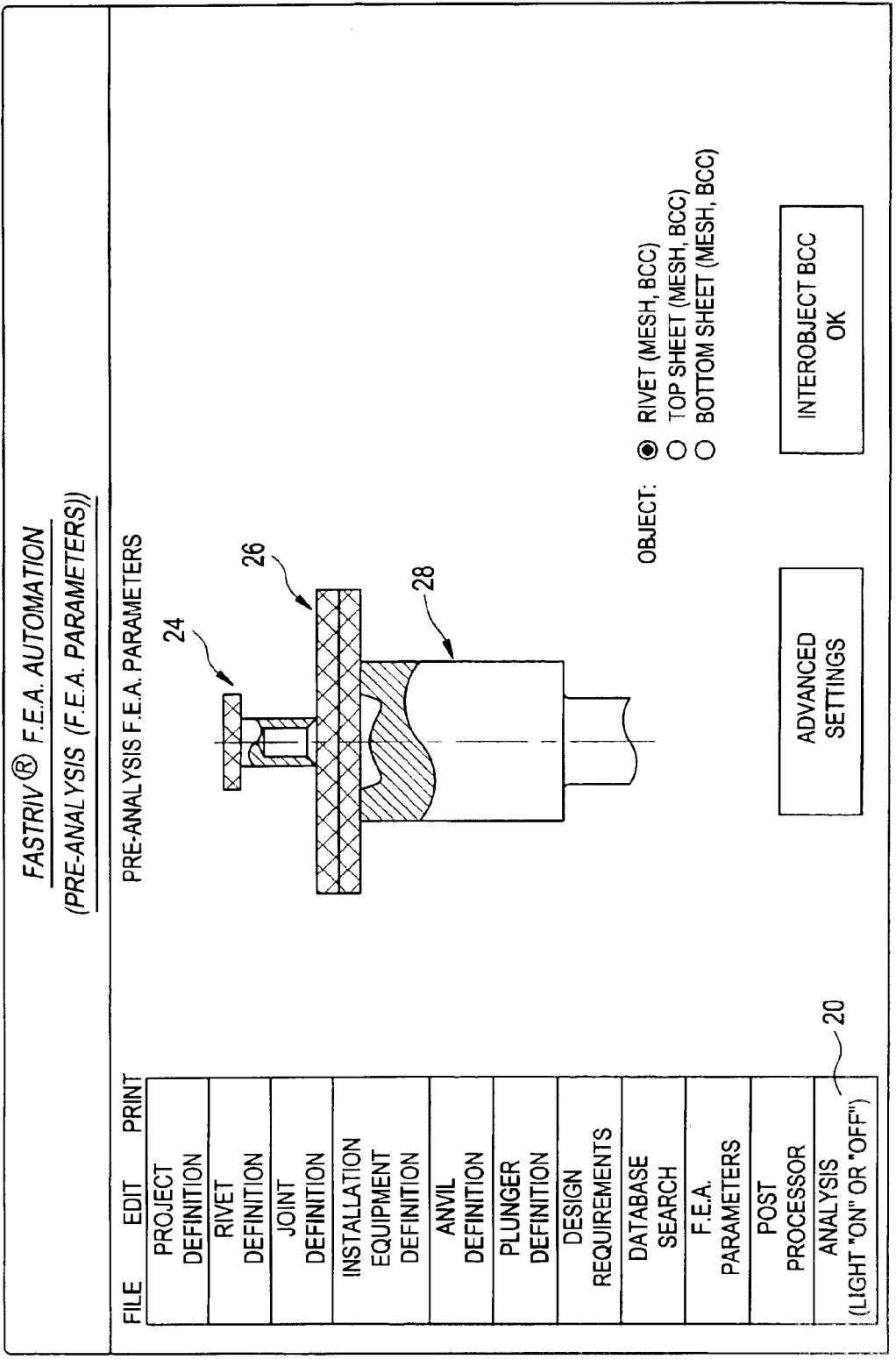

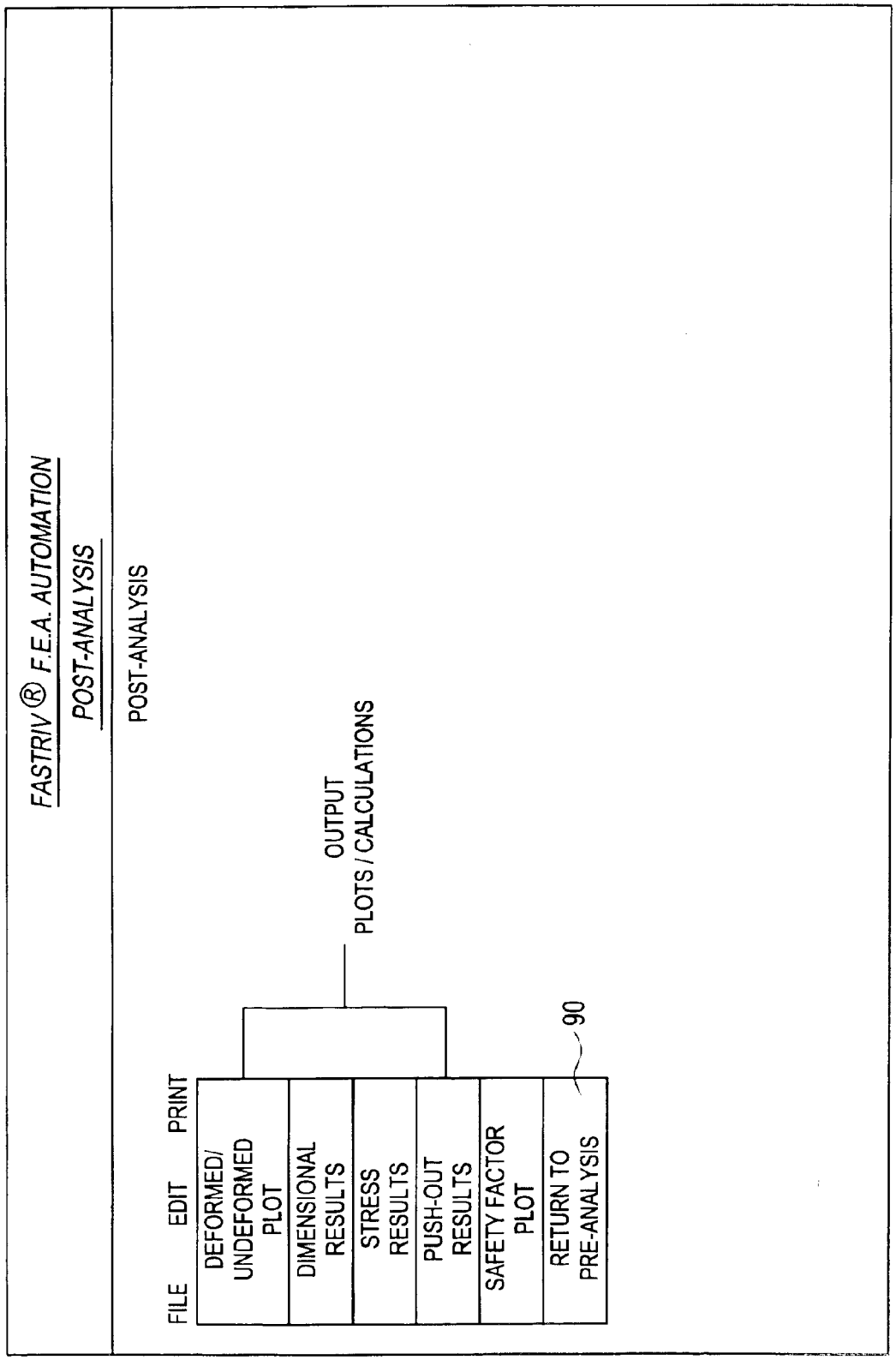

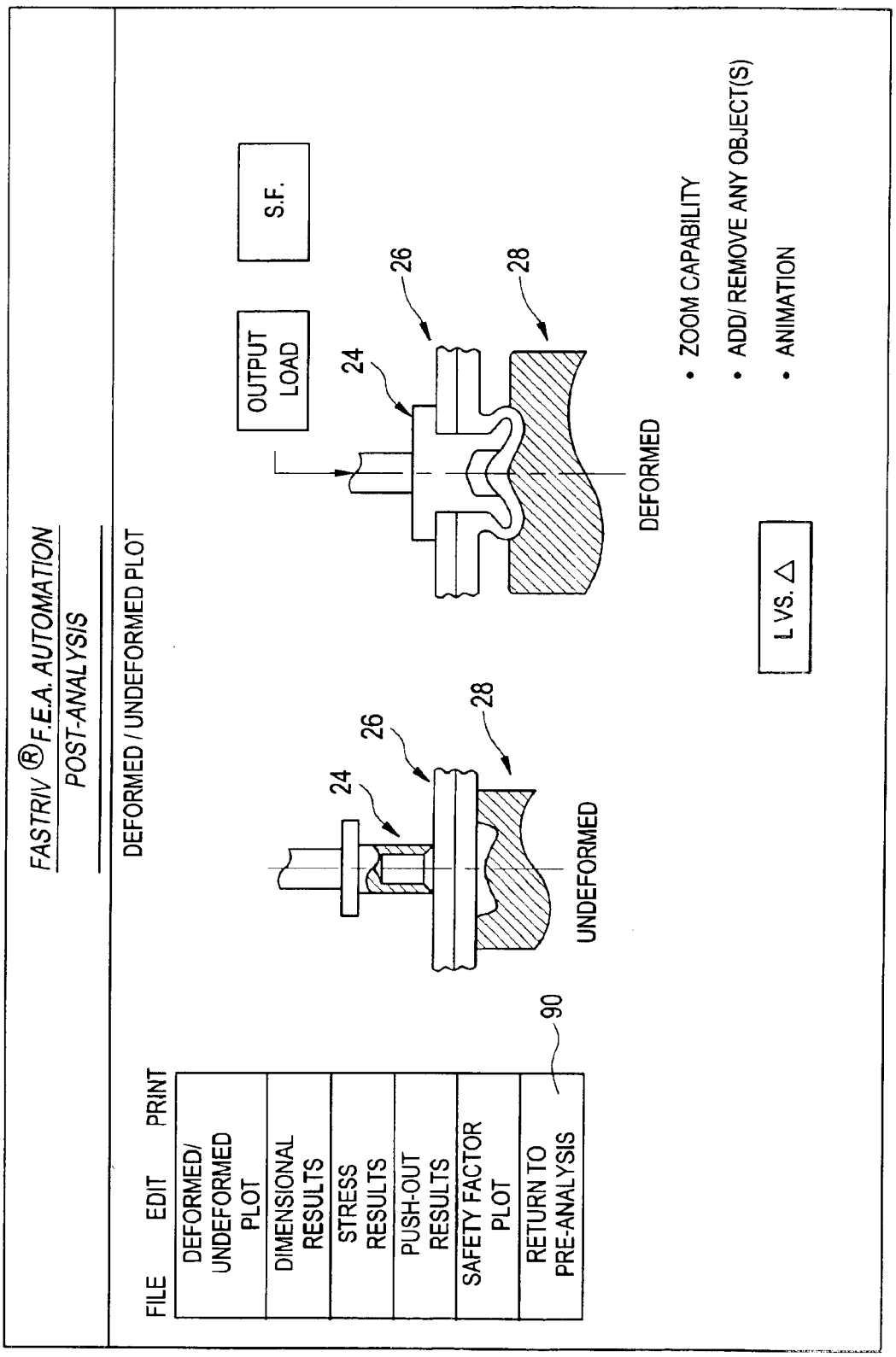

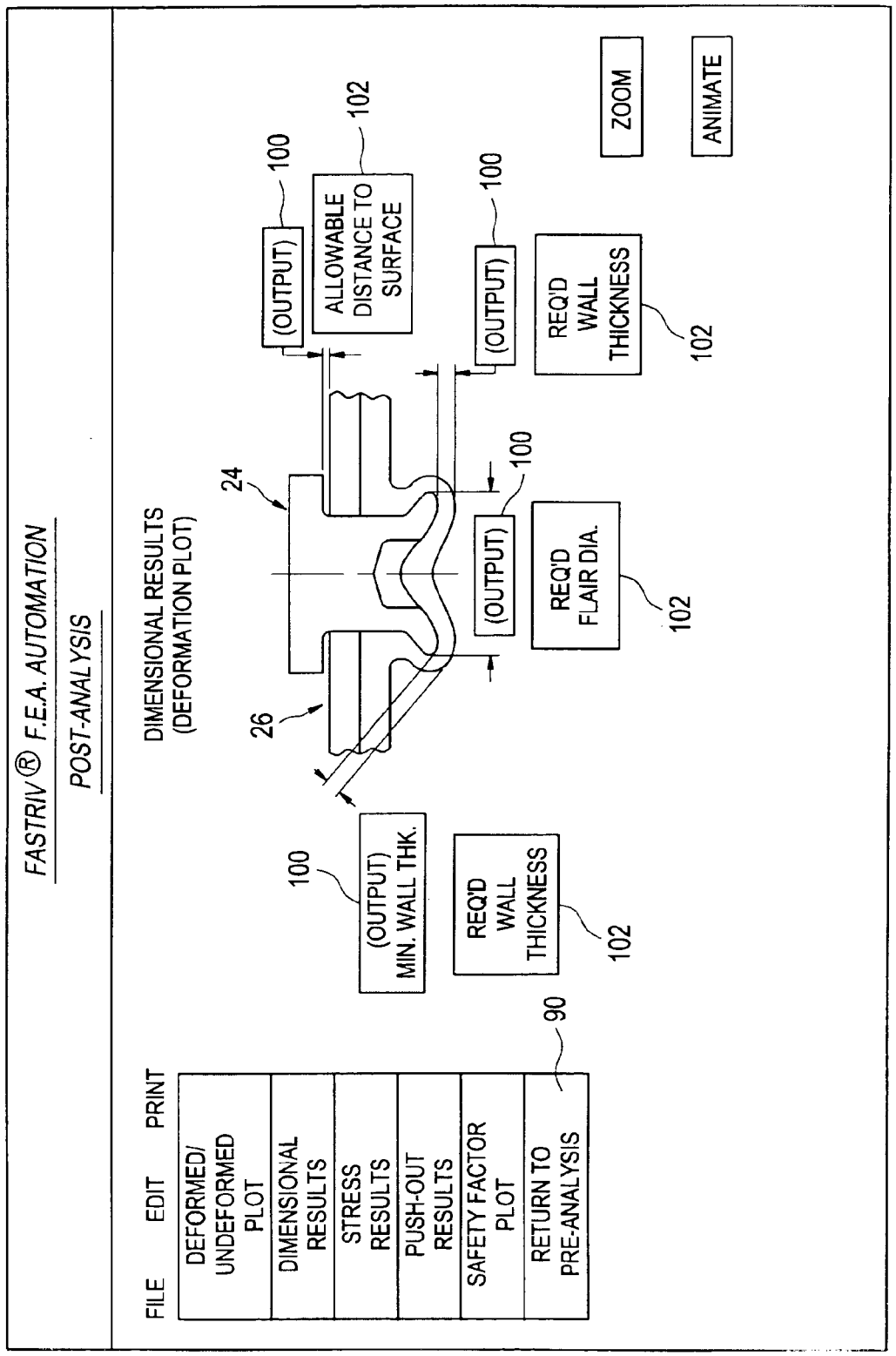

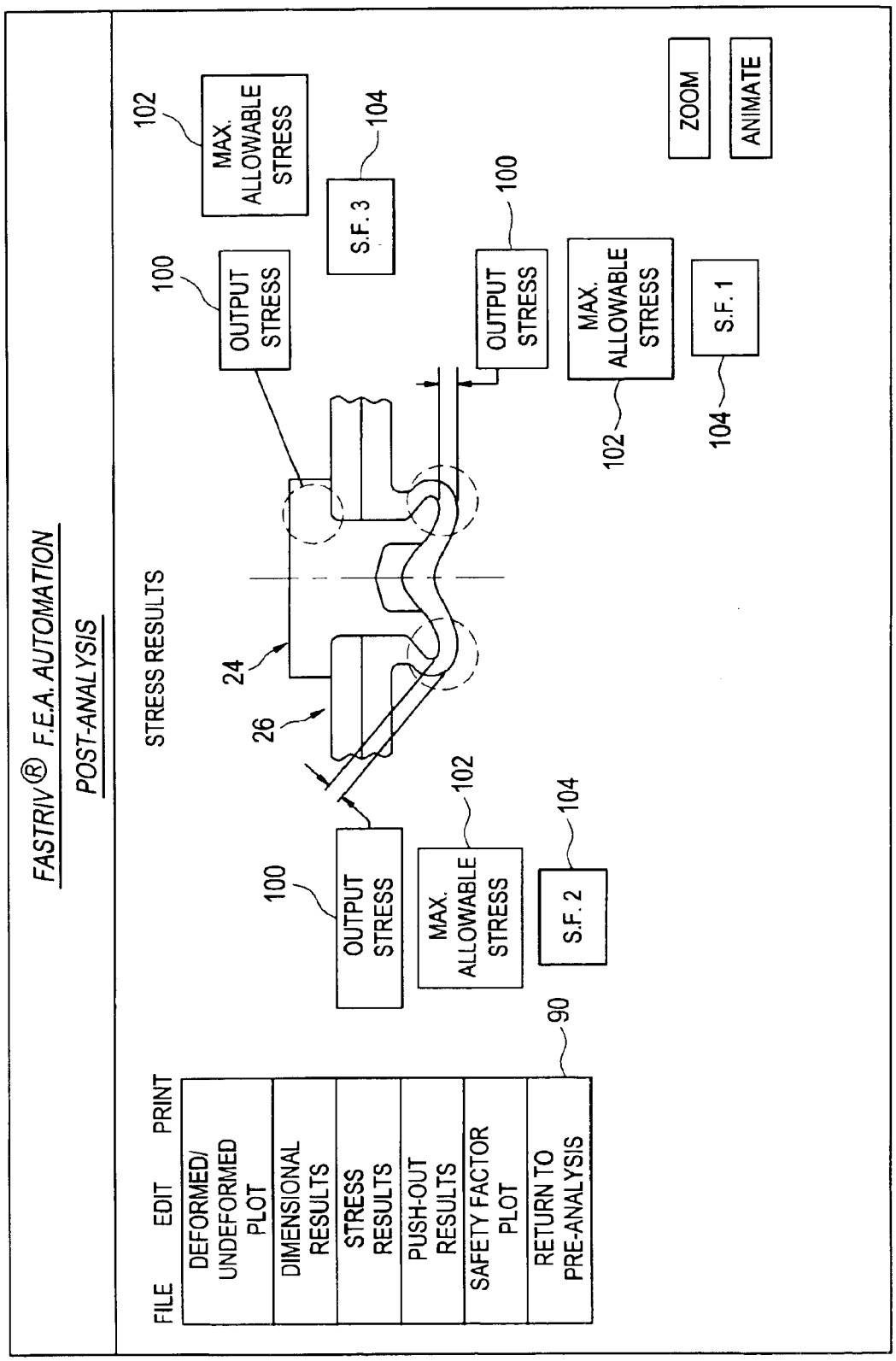

DESIGN SOFTWARE: SELF-PIERCING RIVET ANALYSIS (F.E.A.)

BACKGROUND

This invention generally relates to design software, such as finite element analysis (F.E.A.) software, which engineers use to design things such as self-piercing rivets, and more specifically relates to design software which receives inputs relating to design requirements, performs an analysis of a proposed design, and effectively indicates whether the proposed design meets the design requirements.

Engineers often use design software, such as finite element analysis (F.E.A.) software, to analyze proposed designs, such as self-piercing rivets. Such software typically provides that the engineer inputs some information about the proposed design and directs the software to perform an analysis. The software analyzes the proposed design and generates a stress plot. Once the software has generated the stress plot, the engineer must study the stress plot to determine whether the proposed design is acceptable.

The engineer must determine from the stress plot whether the design meets design requirements as well as determine whether the design is over-designed. With regard to possibly being over-designed, the engineer must determine from the stress plot whether a less robust or cheaper rivet design would still be acceptable and meet the design requirements. If the design appears, from the stress plot, to be unacceptable in light of the design requirements or to be over-designed, the engineer must determine from the stress plot what to change about the design to achieve more acceptable results. This process is typically repeated several times in order to arrive at an acceptable design.

Hence, current design software provides that the design process is a relatively tedious, repetitive trial and error procedure. Additionally, the software provides that the engineer must be skilled at reading a stress plot in order to efficiently use the software.

OBJECTS AND SUMMARY

A general object of an embodiment of the present invention is to provide design software which provides that a user need not be skilled at reading a stress plot in order to use the design software.

Another object of an embodiment of the present invention is to provide design software which receives design requirement inputs and effectively indicates whether a proposed design meets the design requirements.

Still another object of an embodiment of the present invention is to provide design software which provides post-analysis output values for comparison to design requirement input values so an engineer can readily see whether a proposed design is acceptable.

Briefly, and in accordance with at least one of the foregoing objects, an embodiment of the present invention provides design software that is relatively easy to use and provides that a user need not be skilled at reading stress plots. The design software receives design requirement inputs in addition to inputs about the proposed design, performs an analysis, and effectively indicates whether the proposed design meets the design requirements. The design software provides numerical output values for comparison to numerical design requirement input values so the user can readily see whether, and how, the design is unacceptable or is over-designed.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which FIGS. 1–17 are screen shots relating to design software which is in accordance with an embodiment of the present invention. More specifically:

FIG. 1 illustrates an opening screen, a login screen, a disclaimer screen, a pre-analysis screen and an analysis screen;

FIG. 2 illustrates a screen wherein the anvil, workpiece(s) and rivet are displayed;

FIG. 3 illustrates a screen wherein the project is defined;

FIG. 4 illustrates a screen wherein the rivet is defined;

FIG. 5 illustrates a screen wherein the joint is defined;

FIG. 6 illustrates a screen wherein the installation equipment is defined;

FIG. 7 illustrates a screen wherein the anvil is defined;

FIG. 8 illustrates a screen wherein the plunger is defined;

FIG. 9 illustrates a screen wherein design requirements are input;

FIG. 10 illustrates a screen wherein input combinations can be selected and a database searched;

FIG. 11 illustrates a screen wherein finite element analysis parameters are set;

FIG. 12 illustrates a screen relating to post-analysis output plots and calculations;

FIG. 13 illustrates a screen showing the rivet both before and after installation;

FIG. 14 illustrates a screen showing the rivet after installation, and showing a comparison of deformation output values to the design requirement inputs;

FIG. 15 illustrates a screen showing the rivet after installation, and showing a comparison of stress output values to the design requirement inputs;

FIG. 16 illustrates a screen relating to the loading which would be required to push out the rivet after the rivet has been installed; and FIG. 17 illustrates a screen wherein a safety factor plot relating to a plurality of iterations is displayed.

DESCRIPTION

Figure 1:
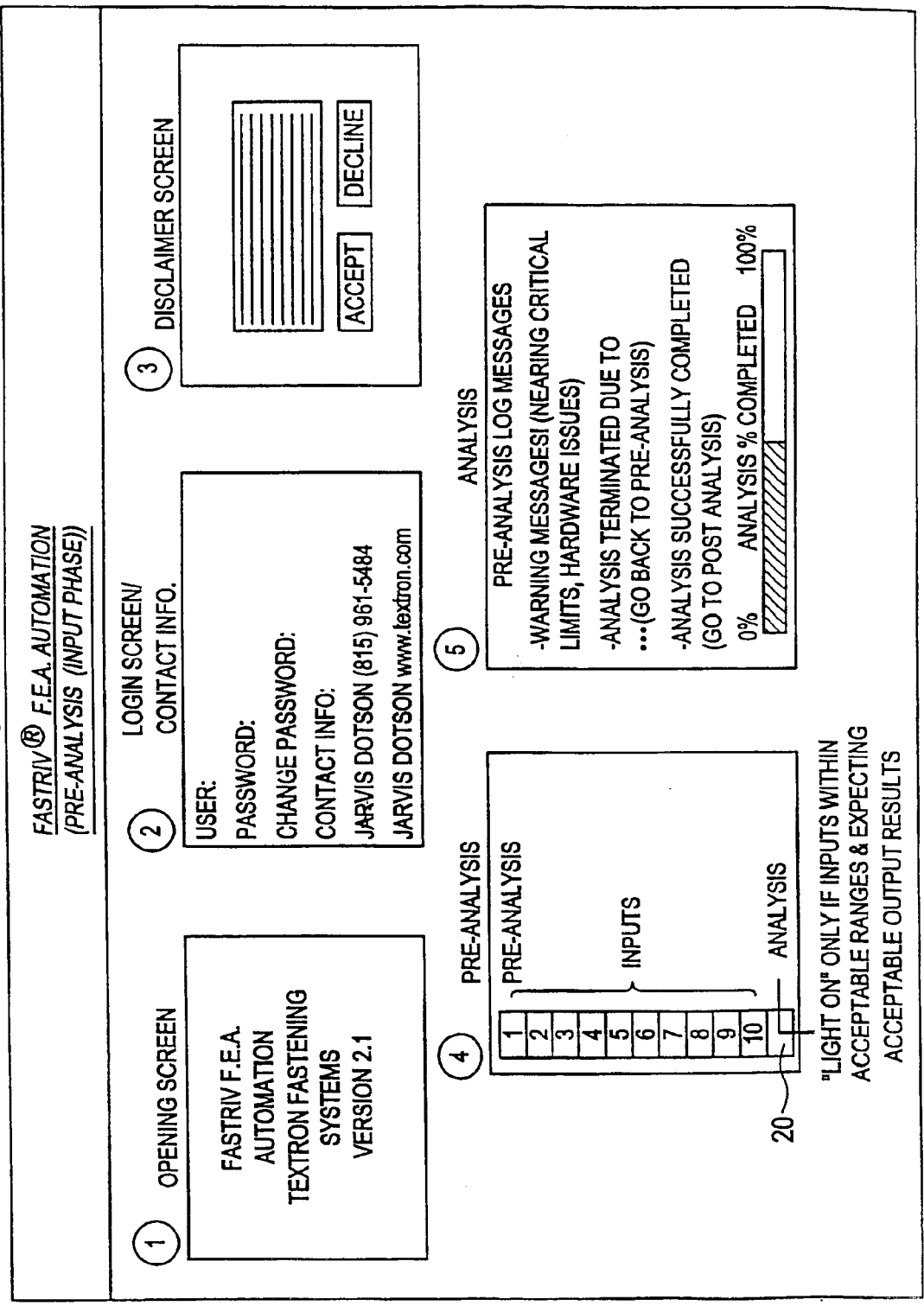

While the present invention may be susceptible to embodiment in different forms, there is shown in the drawings, and herein will be described in detail, an embodiment thereof with the understanding that the present description is to be considered an exemplification of the principles of the invention and is not intended to limit the invention to that as illustrated and described herein.

FIGS. 1–17 are screen shots relating to design software which is in accordance with an embodiment of the present invention. The design software is relatively easy to use and provides that a user need not be skilled at reading a stress plot in order to use the design software. The design software is configured to receive design requirement inputs and effectively indicate whether a proposed design meets the design requirements.

While FIGS. 1–17 illustrate specific screen shots, the screen shots shown are merely representative, and actual screen displays employed in connection with the present invention may look completely different. Additionally, while the screen shots and the following description relate to the situation where the design software is configured for designing self-piercing rivets, the design software may be configured otherwise to allow the analysis and design of other things besides self-piercing rivets.

FIG. 1 illustrates five separate screen shots. Screen shot 1 in FIG. 1 is an opening screen which displays the name, vendor, and version of the software. Screen shot 2 is a login screen wherein a user inputs a user name and password. The screen also provides the user with the opportunity to change the password as well as displays contact information. Screen shot 3 is a disclaimer screen which displays a disclaimer and provides the user with an opportunity to either accept or decline the disclaimer. If the user accepts the disclaimer, the user may use the software and access the other screens.

Once the user has accepted the disclaimer, the software basically operates in three different stages: 1) pre-analysis, wherein inputs are received from the user relating to the proposed design and design requirements; 2) analysis, wherein the proposed design is analyzed; and 3) post-analysis, wherein the results of the analysis can be reviewed by the user, and the proposed design can be assessed with relation to the design requirements.

Screen shot 4 of FIG. 1 is a screen which relates to the pre-analysis stage. The screen includes a list of inputs to be provided by the user, and an analysis "go/no go" indicator 20. As the software receives the inputs from the user (to be described below with reference to FIGS. 3–11), the analysis "go/no go" indicator 20 effectively indicates whether the inputs which have been input are adequate for the software (and computer running the software) to be able to perform an analysis. When the analysis "go/no go" indicator 20 alights, it effectively indicates to the user that a sufficient number of inputs have been received and that the inputs which have been received are acceptable (i.e. they are within acceptable ranges) such that the user may direct the software to perform the analysis. If the analysis "go/no go" indicator 20 is not lit, this basically indicates to the user that there is a fundamental problem with the set of inputs which have been provided—i.e. either the software needs additional information before it (and the computer running the software) can perform the analysis, or one or more of the inputs which have received from the user are outside of an acceptable range such that an analysis cannot be performed or would be impractical. If the analysis "go/no go" indicator 20 alights, the user may click thereon to direct the software to perform the analysis. The software may be configured, for example, to thereafter perform calculations, such as perform a finite element analysis, on the inputs which have been received by the user.

Screen shot 5 is an analysis screen which indicates problems with the analysis, the status of the analysis and/or whether the analysis has been completed. Screen shot 5 appears after the user has input the required information and has directed the software to perform an analysis. In other words, screen shot 5 in FIGURE appears during the analysis stage.

As discussed above, during the pre-analysis stage, the software receives inputs from the user about the proposed design and the design requirements. FIG. 2 is a screen shot which displays during the pre-analysis stage, and displays the list of inputs which are to be received during the pre-analysis stage as well as the analysis "go/no go" indicator 20. As shown, also displayed is a general picture 22 of the proposed design. In the case of a self-piercing rivet, the display includes the rivet 24, the workpieces 26 and the anvil 28, as well as a recess 30 in the anvil 28 for receiving the deformation of the workpieces 26 and rivet 24 during rivet installation.

FIGS. 3–11 are screen shots which relate to the inputs which are received from the user during the pre-analysis stage. To get to any of the screens shown in FIGS. 3–11, the user merely need click the corresponding button in the list of inputs above the analysis "go/no go" indicator 20. The screen shown in FIG. 3 provides that a user can define the project, which allows the computer to save the project so that it can be recalled by the user. This also provides that a database of projects can be formed. The screen shown in FIG. 4 provides that the user can define the head style of the rivet, which cause the software to display output values relating to the width of the head of the rivet (dimension 40) and the thickness of the head of the rivet (dimension 42). As shown in FIG. 4, the following aspects of the rivet can also be defined by the user: the external (dimension 44) and internal (dimension 46) diameter, the length of the main portion of the rivet (dimension 48), and the length of the legs 50 of the rivet (dimension 52). Additionally, the material which forms the rivet may be defined. As shown, the software may be configured such that some or all of the items may be defined using pull down menus.

The screen shown in FIG. 5 provides that the user can define the joint. As shown, the width (dimensions 60, 62) and material of the top and bottom sheets (i.e. the workpieces) can be defined, and the software may be configured such these items may be defined using pull down menus.

The screen shown in FIG. 6 provides that the user can define the installation equipment 64. As shown, the software outputs the collective height (dimension 66) of the workpieces 26 and rivet 24, and the user inputs dimension 68 relating to the rivet machine 64, such as by using a pull down menu. Additionally, the installation speed and maximum cylinder pressure can be defined.

The screen shown in FIG. 7 provides that the user can define the anvil 28. As shown, the depth of the pocket or recess (dimension 70) in the anvil 28 can be defined, as well as the anvil type and the material which forms the anvil. Of course, the software may be configured such that pull down menus can be implemented.

The screen shown in FIG. 8 provides that the software displays information about the plunger 80, such as dimensions 82 and 84, and that the user can define the material that forms the plunger 80.

Figure 9:
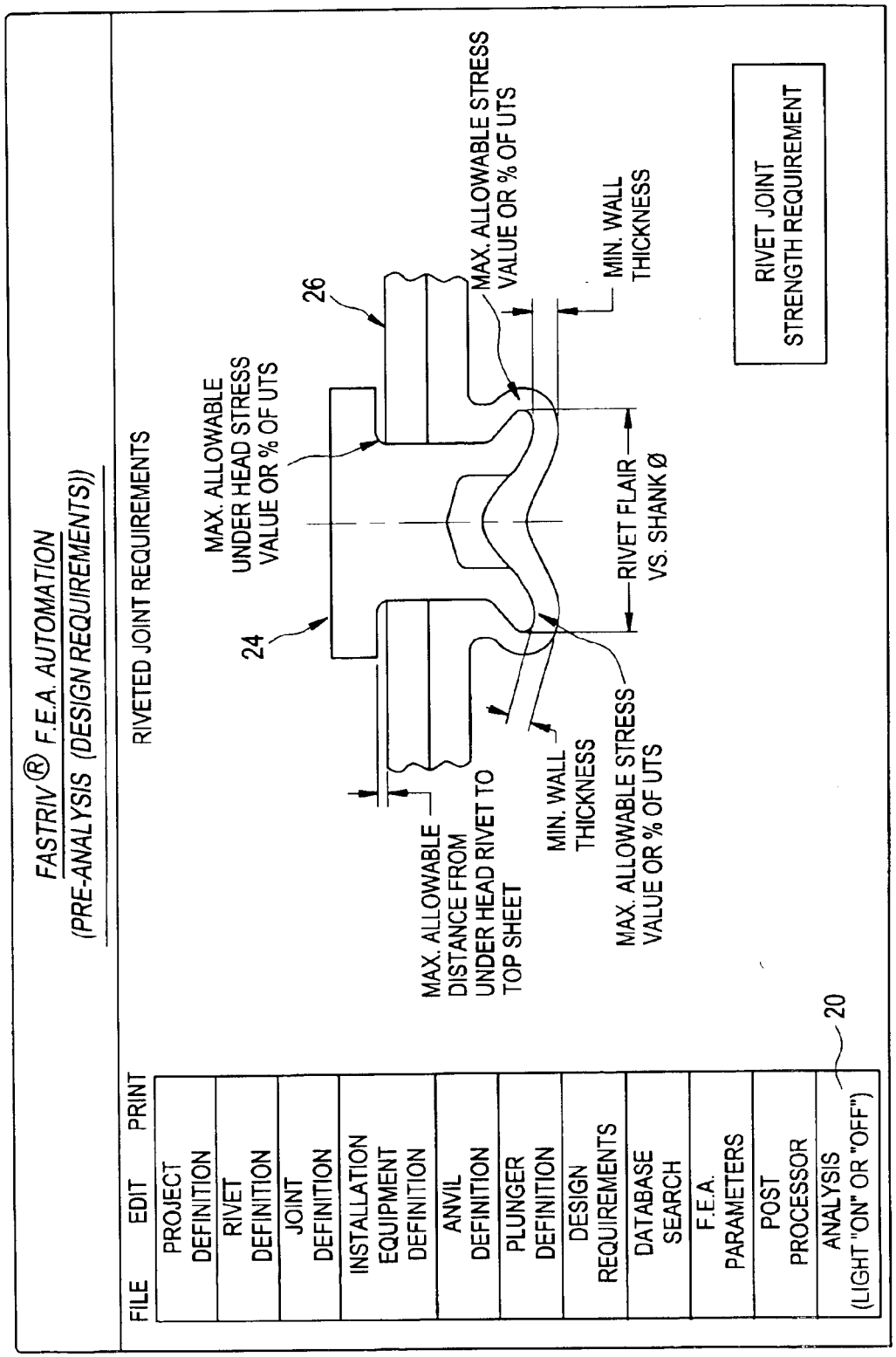

The screen shown in FIG. 9 provides that the user can input design requirements. Specifically, FIG. 9 provides that the user can input the riveted joint requirements. As shown, minimum wall thicknesses can be defined, as well as maximum stress values. Further, a maximum allowable distance from under the head of the rivet to the top sheet can be input, and well as a requirement with regard to the rivet flair.

The screen shown in FIG. 10 provides that a database is searched after the inputs have been received to identify any previous projects which are very similar to that which has been defined by the user. Additionally, the software may be configured such that the user can selectively search the database for a given project which has been analyzed and saved previously.

The screen shown in FIG. 11 provides that parameters regarding the analysis can be defined. For example, if the software is configured to perform a finite element analysis, then parameters regarding the finite element analysis can be defined.

FIG. 12 is a screen shot which generally relates to the post-analysis stage (i.e. after the user has input all the required values (generally FIGS. 3–11), has clicked the analysis button 20, and the computer has finished performing the analysis). The screen shown in FIG. 12 provides a list of output plots and results which can be reviewed, as well as a button 90 which can be clicked to return to the pre-analysis stage (i.e. generally FIGS. 3–11). To get to any of the screens shown in FIGS. 13–17, the user merely need click the corresponding button in the list above button 90.

FIGS. 13–17 are screen shots which relate to the output plots and results which are generated by the software and which can be reviewed by the user. The screen shown in FIG. 13 provides a plot of the rivet both in the deformed and undeformed state, as well as lists the output load and the safety factor ("S.F."). As shown, the software may be such that there is a zoom capability, the ability to add or remove objects and an animation capability, wherein the rivet is shown being installed into the workpieces.

The screen shown in FIG. 14 provides a deformation plot which displays dimensional results. As shown, the software may be configured such that output values 100 relating to dimensions are displayed (i.e. values relating to deformation which the software and computer have calculated during the analysis) proximate the corresponding design requirement input values 102 (see FIG. 9) for comparison. In other words, the software is configured such that output values 100 are listed next to design requirement input values 102 for comparison. This provides that the user can readily see if the design meets design requirements and whether and how the design is over-designed. The software may be configured such that output values which meet design requirements appear in one color, such as green, while output values which do not meet design requirements appear in another color, such as red. Alternatively, the output values can be mathematically compared to the design requirement inputs value and only a resulting mathematical value can be displayed. Regardless, the important aspect is that the software is configured to effectively allow a comparison of output values to design requirement input values so that the user can determine quickly and easily whether the design is acceptable. As shown in FIG. 14, the software may also have a zoom and animation capability with regard to the deformation plot.

FIG. 15 is much like FIG. 14, but provides stress results instead of deformation results. Like FIG. 14, the screen shown in FIG. 15 provides a comparison of output values 100 and corresponding design requirement input values 102 so that the user can quickly and easily see whether the proposed design is acceptable. Additionally, safety factors ("S.F.") 104 are displayed.

Figure 16:
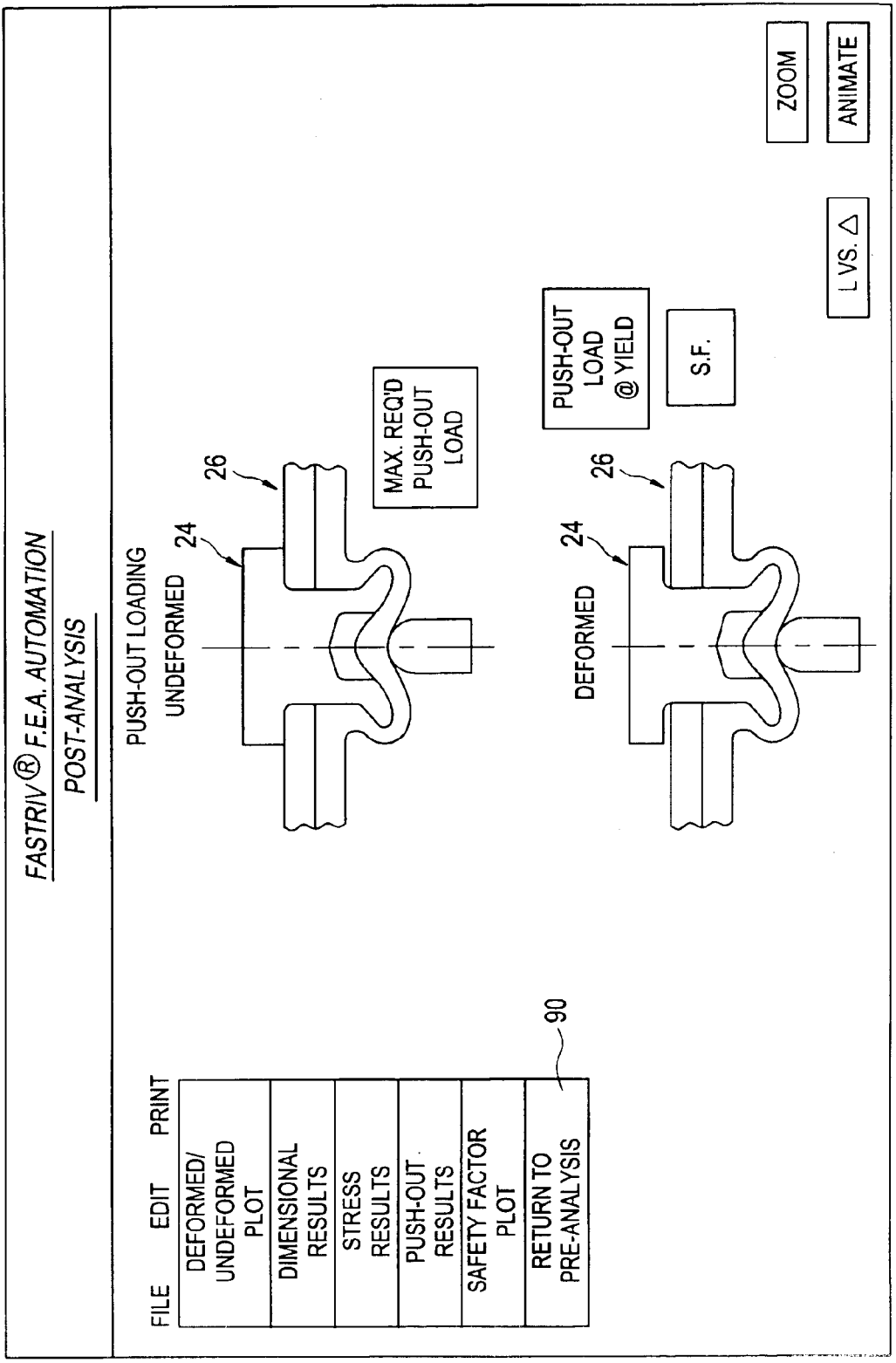

FIG. 16 is a screen shot which relates to push-out loading, or the load required to push the rivet out after it has been installed. As shown, the screen may display the maximum required push-out load (which may have been input as a design requirement) and the push-out load at yield.

Figure 17:
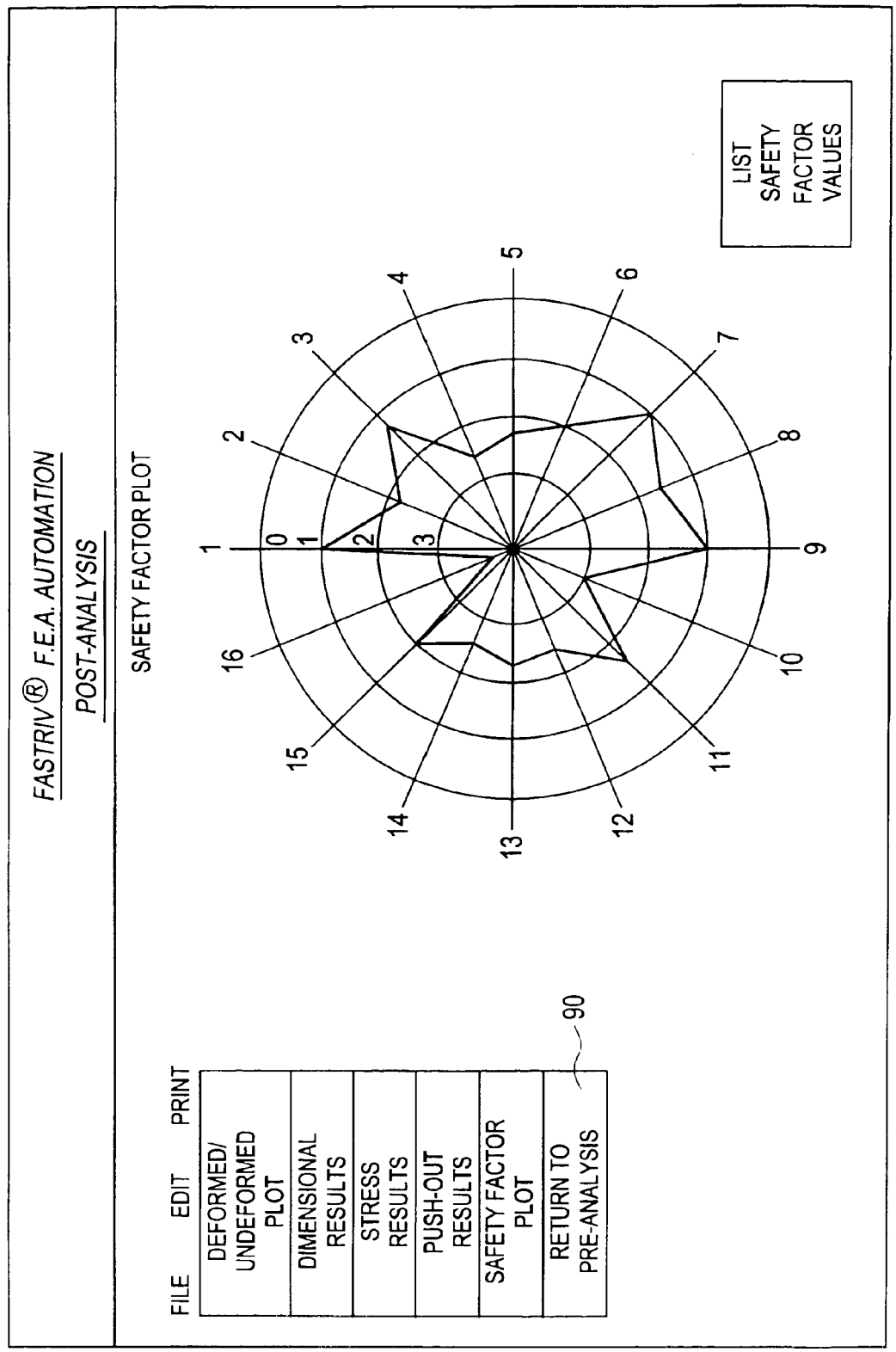

Preferably, the software is configured such that it calculates safety factors of the proposed design based on the inputs regarding the proposed design and design requirements which have been received. As shown in FIG. 17, preferably the software is configured to display a safety factor plot which effectively lists the safety factor corresponding to each of the design requirement input values (in FIG. 17 there are sixteen). This provides that the user can go back and change the design input values, attempting to arrive at a "bulls eye" wherein each of the safety factors approaches zero. Hence, the safety factor plot allows the user to arrive at an optimum design quickly and easily, effectively guiding the user toward the optimum design.

In summary, to use the software, the user runs the software (screen 1 in FIG. 1), logs in (screen 2 in FIG. 1), and accepts the disclaimer (screen 3 in FIG. 1). The software then goes into a pre-analysis stage (screen 4 in FIG. 1, and FIG. 2), wherein the user can input values regarding the proposed design and design requirements (FIGS. 3–9) as well as define parameters regarding the analysis to be conducted (FIG. 11). A database of input values and analysis results may also be searched (FIG. 10). Once enough inputs have received and the inputs are within acceptable ranges, the analysis "go/no go" indicator 20 (see FIGS. 2–11) indicates that an analysis can be performed. Then, the user can direct the software to perform the analysis (such as by clicking on the analysis button 20—FIGS. 2–11). The software (and computer running the software) then performs the analysis (screen 5 in FIG. 5), and thereafter goes into the post-analysis stage (FIG. 12) wherein the user can view analysis results (i.e. output values) and plots (FIGS. 13–17). As described above, the software facilitates a comparison of the output values with design requirement input values. Hence, the user can readily see whether the design is acceptable. After the user has viewed the results of the analysis, the user can go back to the pre-analysis phase (such as by clicking on button 90 on FIGS. 12–17) and try different input values.

Again, while FIGS. 1–17 illustrate specific screen shots, the screen shots shown are merely representative, and actual screen displays employed in connection with the present invention may look completely different. For example, the software may be configured such that user does not physically enter the design requirement input values, but rather pulls up a file containing same. Additionally, while the screen shots and the foregoing description relate to the situation where the design software is configured for designing self-piercing rivets, the design software may be configured otherwise to allow the analysis and design of other things besides self-piercing rivets.

As described above, the software is relatively easy to use and provides that a user need not be skilled at reading stress plots. The software receives design requirement input values and effectively indicates whether the proposed design meets the design requirements. Hence, the software is configured such that a user can come to an acceptable design quickly and easily, and may try to optimize the design relatively easy using the software.

While an embodiment of the present invention is shown and described, it is envisioned that those skilled in the art may devise various modifications of the present invention without departing from the spirit and scope of the following claims.

What is claimed is:

1. Design software, which when executed on a computer, performs an analysis on a proposed design and application, said design software configured to receive inputs regarding the proposed design and the application as well as inputs regarding design requirements, said design software configured to perform calculations on the inputs regarding the proposed design and the application and generate numerical output values based on the calculations, said design software configured to compare said numerical output values to said inputs regarding the design requirements, thereby indicating whether the proposed design meets the design requirements.

2. Design software as recited in claim 1, wherein said design software is configured to display the numerical output values generally proximate corresponding design requirements for comparison.

3. Design software as recited in claim 1, wherein said design software is configured to provide a go/no go indication while the inputs are being received, and before the calculations are performed.

4. Design software as recited in claim 1, wherein said design software is configured to generate a deformation plot indicating design requirement inputs relating to deformation and indicating, for comparison, numerical output values relating to deformation.

5. Design software as recited in claim 1, wherein said design software is configured to generate a stress results plot indicating design requirement inputs relating to stress and indicating, for comparison, numerical output values relating to stress.

6. Design software as recited in claim 1, wherein said design software is configured to generate a deformation plot indicating design requirement inputs relating to deformation and indicating, for comparison, numerical output values relating to deformation, and wherein said design software is configured to generate a stress results plot indicating design requirement inputs relating to stress and indicating, for comparison, numerical output values relating to stress.

7. Design software as recited in claim 1, wherein said design software is configured to calculate a safety factors based on inputs received relating to the proposed design and the design requirements, and configured to generate a safety factor plot.

8. Design software, which when executed on a computer, performs an analysis on a proposed rivet design and application, said design software configured to receive inputs regarding the proposed rivet design and the application as well as inputs regarding design requirements, said design software configured to perform calculations on the inputs regarding the proposed rivet design and the application and generate numerical output values based on the calculations, said design software configured to compare said numerical output values to said inputs regarding the design requirements, thereby indicating whether the proposed rivet design meets the design requirements.

9. Design software as recited in claim 8, wherein said design software is configured to display the numerical output values generally proximate corresponding design requirements for comparison.

10. Design software as recited in claim 8, wherein said design software is configured to provide a go/no go indication while the inputs are being received, and before the calculations are performed.

11. Design software as recited in claim 8, wherein said design software is configured to generate a deformation plot indicating design requirement inputs relating to deformation and indicating, for comparison, numerical output values relating to deformation.

12. Design software as recited in claim 8, wherein said design software is configured to generate a stress results plot indicating design requirement inputs relating to stress and indicating, for comparison, numerical output values relating to stress.

13. Design software as recited in claim 8, wherein said design software is configured to generate a deformation plot indicating design requirement inputs relating to deformation and indicating, for comparison, numerical output values relating to deformation, and wherein said design software is configured to generate a stress results plot indicating design requirement inputs relating to stress and indicating, for comparison, numerical output values relating to stress.

14. Design software as recited in claim 8, wherein said design software is configured to calculate a safety factor based on inputs received relating to the proposed rivet design and the design requirements, and configured to generate a safety factor plot.

15. Design software as recited in claim 8, wherein said inputs regarding the design requirements include at least one of: minimum wall thickness, maximum allowable stress maximum rivet flair, maximum allowable distance from a bottom of a head of the rivet to a workpiece surface, and a maximum allowable under head stress value.

16. A method of designing something using design software executed on a computer, wherein said method comprises: inputting numerical values relating to a proposed design, an application and design requirements; having said design software perform calculations on the inputs regarding the proposed design and the application and generate numerical output values based on the calculations; and comparing said numerical output values to said inputs regarding the design requirements, thereby determining whether the proposed design meets the design requirements.

17. A method as recited in claim 16, further comprising having the design software generate a deformation plot which indicates design requirement inputs relating to deformation and indicates, for comparison, numerical output values relating to deformation, and viewing the deformation plot to determine whether the proposed design meets the design requirements relating to deformation.

18. A method as recited in claim 16, further comprising having the design software generate a stress results plot which indicates design requirement inputs relating to stress and indicates, for comparison, numerical output values relating to stress, and viewing the stress results plot to determine whether the proposed design meets the design requirements relating to stress.

19. A method as recited in claim 16, further comprising having the design software calculate a safety factor based on inputs received relating to the proposed design and the design requirements, having the design software generate a safety factor plot, and viewing the safety factor plot.

* * * * *